United States Patent
Mai

(10) Patent No.: US 9,979,398 B2
(45) Date of Patent: May 22, 2018

(54) BUFFER CIRCUIT AND ELECTRONIC DEVICE USING SAME

(71) Applicant: Capital Microelectronics Co., Ltd., Beijing (CN)

(72) Inventor: Rifeng Mai, Beijing (CN)

(73) Assignee: CAPITAL MICROELECTRONICS CO., LTD., Beijing (CN)

( * ) Notice: Subject to any disclaimer, the term of this patent is extended or adjusted under 35 U.S.C. 154(b) by 0 days. days.

(21) Appl. No.: 14/902,241

(22) PCT Filed: May 6, 2015

(86) PCT No.: PCT/CN2015/078369
§ 371 (c)(1),
(2) Date: Dec. 30, 2015

(87) PCT Pub. No.: WO2016/176836
PCT Pub. Date: Nov. 10, 2016

(65) Prior Publication Data
US 2017/0111047 A1   Apr. 20, 2017

(51) Int. Cl.
*H03K 19/0185* (2006.01)

(52) U.S. Cl.
CPC ................ *H03K 19/018521* (2013.01)

(58) Field of Classification Search
CPC ........... H03K 19/0175; H03K 19/0185; H03K 19/018507; H03K 19/018521; H03K 19/018571
USPC ......... 326/21, 26–27, 31, 34, 80–83, 86–87; 327/108–109, 112
See application file for complete search history.

(56) References Cited

U.S. PATENT DOCUMENTS

| | | | | |
|---|---|---|---|---|
| 4,700,089 A * | 10/1987 | Fujii | ............... | H03K 5/133 326/121 |
| 5,117,131 A * | 5/1992 | Ochi | ............ | H03K 19/018521 326/103 |
| 5,391,939 A * | 2/1995 | Nonaka | ........... | H03K 19/00361 326/121 |
| 5,519,344 A * | 5/1996 | Proebsting | ........... | G11C 7/1051 326/17 |
| 5,583,457 A * | 12/1996 | Horiguchi | ............. | G06F 1/3203 326/121 |
| 5,594,361 A * | 1/1997 | Campbell | ............... | H03K 3/03 326/24 |
| 5,672,983 A * | 9/1997 | Yamamoto | ....... | H03K 19/00361 326/27 |
| 5,717,343 A * | 2/1998 | Kwong | ............ | H03K 19/00361 326/121 |
| 5,760,620 A * | 6/1998 | Doluca | ................. | H03F 3/3001 326/83 |

(Continued)

*Primary Examiner* — Jason M Crawford
(74) *Attorney, Agent, or Firm* — Buchanan Ingersoll & Rooney PC

(57) ABSTRACT

A buffer circuit includes a buffer group including an odd number of cascade buffers, where the buffers may be different from each other; a PMOS transistor and an NMOS transistor; where a source of the PMOS transistor is coupled to a power source, a drain thereof is connected to an output terminal of the buffer group, and a gate thereof is connected to an input terminal of the buffer group; a source of the NMOS transistor is coupled to ground, a drain thereof is connected to the output terminal of the buffer group, and a gate thereof is connected to the input terminal of the buffer group.

7 Claims, 2 Drawing Sheets

(56) References Cited

U.S. PATENT DOCUMENTS

| | | | | |
|---|---|---|---|---|
| 5,821,783 | A * | 10/1998 | Torimaru | H03K 19/00361 |
| | | | | 326/87 |
| 6,100,729 | A * | 8/2000 | Nagano | H03K 17/164 |
| | | | | 326/27 |
| 6,335,638 | B1 * | 1/2002 | Kwong | G06F 1/10 |
| | | | | 326/28 |
| 6,426,654 | B2 * | 7/2002 | Masuda | G06F 13/4077 |
| | | | | 326/86 |
| 6,462,597 | B2 * | 10/2002 | Lee | H03K 5/133 |
| | | | | 326/85 |
| 7,167,038 | B2 * | 1/2007 | Maxwell | H03K 19/0013 |
| | | | | 326/27 |
| 7,276,940 | B2 * | 10/2007 | Song | H03F 3/347 |
| | | | | 326/83 |
| 7,724,036 | B2 * | 5/2010 | Das | H03K 19/096 |
| | | | | 326/93 |
| 7,982,500 | B2 * | 7/2011 | Luich | H03K 19/018528 |
| | | | | 326/66 |
| 2004/0061535 | A1 * | 4/2004 | Nair | H03K 19/00384 |
| | | | | 327/112 |
| 2005/0225352 | A1 * | 10/2005 | Kuang | H03K 19/0016 |
| | | | | 326/27 |
| 2005/0237085 | A1 * | 10/2005 | Ojiro | H03K 17/164 |
| | | | | 326/87 |
| 2006/0033531 | A1 * | 2/2006 | Ngo | H03K 17/167 |
| | | | | 326/83 |
| 2010/0164578 | A1 * | 7/2010 | Masleid | H03K 3/012 |
| | | | | 327/165 |
| 2015/0270258 | A1 * | 9/2015 | Dabral | H01L 27/0285 |
| | | | | 361/56 |

* cited by examiner

BUFFER CIRCUIT AND ELECTRONIC DEVICE USING SAME

BACKGROUND

Technical Field

The present invention relates to an electronic device, and in particular, to a buffer circuit used in the electronic device.

Related Art

Buffers are widely used in various electronic devices for timing, driving and so on. In some cases, such as in a clock tree, driving of different levels are required due to more and more complicated designs. FIG. 1 illustrates an example of a buffer cascade including two levels of buffers. A buffer usually includes an inverter, and the output driving capability of the buffer merely depends on tube properties of the output level, and is irrelevant to a logic state of each input terminal. The higher level the buffer is in, the more the energy it consumes because more units are to be driven. Therefore, greater driving capability is required.

However, as the number of the levels goes higher, time delay and power consumption also increase sharply. The higher the level, the greater the demands on the driving capability is because an increased number of components are to be driven, hence the greater the power consumption. The result of a peak current increase may be that an instantaneous peak current/voltage surpasses the capacity of the power source and leads to component damage, functional failure, and so on.

SUMMARY

In the first aspect, the present invention provides a buffer circuit. The buffer circuit includes: a buffer group including an odd number of cascaded buffers, where the buffers may be different from each other; a PMOS transistor and an NMOS transistor; where a source of the PMOS transistor is coupled to a power source, a drain thereof is connected to an output terminal of the buffer group, and a gate thereof is connected to an input terminal of the buffer group; a source of the NMOS transistor is coupled to ground, a drain thereof is connected to the output terminal of the buffer group, and a gate thereof is connected to the input terminal of the buffer group.

Preferably, a driving capability of the PMOS transistor and the NMOS transistor is one half or a quarter of a driving capability of a buffer with the highest level in the buffer group.

In the second aspect, the present invention provides an electronic device including the buffer circuit described in the first aspect.

An embodiment of the present invention effectively improves the reaction speed of the buffer and reduces the peak current to some extent (about 20%-30%), and therefore, the possibility of circuit damage and functional failure is lower.

DETAILED DESCRIPTION

Technical solutions of the present invention are described below in detail with the accompanying drawings and embodiments.

Figure 1:
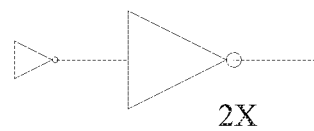
FIG. 1 illustrates an example of a buffer cascade.
Figure 2:
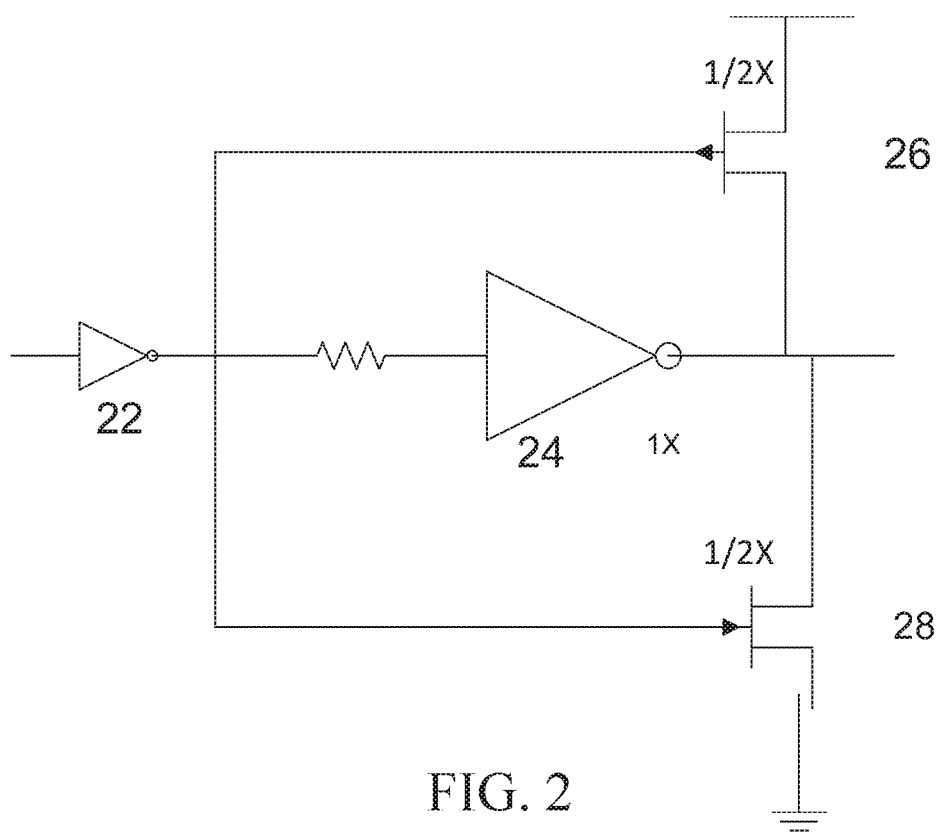
FIG. 2 is a schematic diagram of a buffer circuit according to an embodiment of the present invention.

FIG. 2 is a schematic diagram of a buffer circuit according to an embodiment of the present invention. As shown in FIG. 2, the buffer circuit includes a first-level buffer 22, a second-level buffer 24, a PMOS transistor 26 and an NMOS transistor 28. A resistor 23 is arranged between the second-level buffer 24 and the first-level buffer 22, and the resistor 23 has small resistance. A source of the PMOS transistor 26 is coupled to a power source, a drain thereof is connected to an output terminal of the second-level buffer 24, and a gate thereof is connected to an output terminal of the first-level buffer 22. A source of the NMOS transistor 28 is coupled to ground, a drain thereof is connected to the output terminal of the second-level buffer 24, and a gate thereof is connected to the output terminal of the first-level buffer 22.

In operation, when there occurs a jump in an output terminal signal of the first-level buffer 22, for example a downward jump, the second-level buffer 24 reacts relatively slow because it is bulky and cannot follow the jump instantaneously; and the PMOS transistor 26 is turned on first under the influence of a lowered gate voltage, which makes the drain jump quickly to high level. A driving capability of the PMOS transistor can be set to ½ of that of the second-level buffer 24, so the current right now is only ½ of that in regular situation. Later, the second-level buffer 24 also finishes its upward jump, and now the driving current at the output terminal of the buffer 24 becomes 1+½.

Similarly, when there occurs a jump in the output terminal signal of the first-level buffer 22, for example an upward jump, the second-level buffer 24 reacts relatively slow because it is bulky and cannot follow the jump instantaneously; and the NMOS transistor 28 is turned on first under the influence of a raised gate voltage, which makes the drain jump quickly to low level. A driving capability of the NMOS transistor can be set to ½ of that of the second-level buffer, so the current right now is only ½ of that in regular situation. Later, the second-level buffer 24 also finishes its upward jump, and now the driving current at the output terminal of the buffer 24 becomes 1+½. The embodiment of the present invention effectively raises the reaction speed of the buffer and reduces the peak current to some extent (about 20%-30%) compared with that in regular situation (where usually two times of driving current is required), and therefore, the possibility of circuit damage and functional failure is lower.

The embodiment of the present invention is also applicable to the case where multiple buffers are cascaded.

Figure 3:
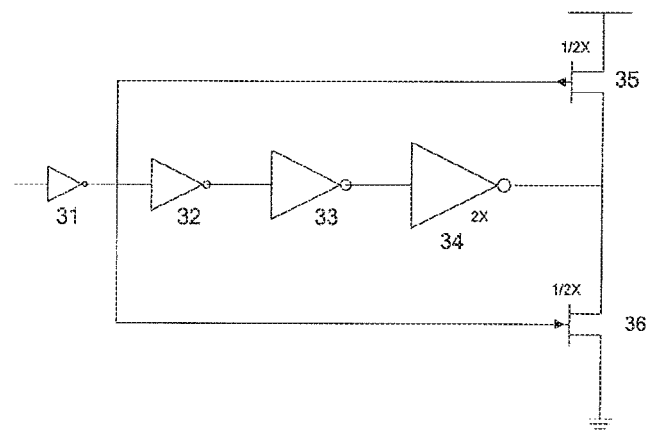
FIG. 3 is a schematic diagram of a buffer circuit according to another embodiment of the present invention.

FIG. 3 is a schematic diagram of a buffer circuit according to an embodiment of the present invention. Different from FIG. 2, FIG. 3 includes four levels of buffers 31-34 as well as a PMOS transistor 35 and an NMOS transistor 36.

The buffers 32-34 are cascaded with each other and form a buffer group. Each buffer may have different size and thereby have different driving capability.

A source of the PMOS transistor 35 is connected to a power source, a drain thereof is connected to an output terminal of the fourth-level buffer 34, and a gate thereof is connected to an output terminal of the first-level buffer 31. A source of the NMOS transistor 36 is connected to ground, a source thereof is connected to the output terminal of the fourth-level buffer 34, and a gate thereof is connected to the output terminal of the first-level buffer 31.

In operation, when there occurs a jump in an output terminal signal of the first-level buffer 31, for example a downward jump, the fourth-level buffer 34 cannot follow the jump instantaneously due to the time delay and its size; and the PMOS transistor 35 is turned on first under the influence of a lowered gate voltage, which makes the drain jump quickly to high level, and the driving capability of the PMOS transistor is ½, so the current at the output terminal of the fourth-level buffer 34 right now is ½ of that in regular situation. Later, the fourth-level buffer 34 also finishes its upward jump along with the inversion of the second-level buffer 32 and the third-level buffer 33. If the driving capability of the fourth-level driver 34 is 2× and the driving capability of the PMOS transistor 35 is ½X, the driving current at the output terminal of the buffer 34 right now will be 2+½.

Similarly, when there occurs a jump in the output terminal signal of the first-level buffer 31, for example an upward jump, the fourth-level buffer 34 cannot follow the jump instantaneously; and the NMOS transistor 36 is turned on first under the influence of a raised gate voltage, which makes the drain jump quickly to low level. The driving capability of the NMOS transistor is assumed to be ½ of that in regular situation, so the current at the output terminal of the fourth-level buffer 34 right now is only ½ of that in regular situation. Later, the fourth-level buffer 34 also finishes its downward jump along with the inversion of the second-level buffer 32 and the third-level buffer 33, and the driving current in the output terminal of the buffer 24 right now is 2+½.

Figure 4:
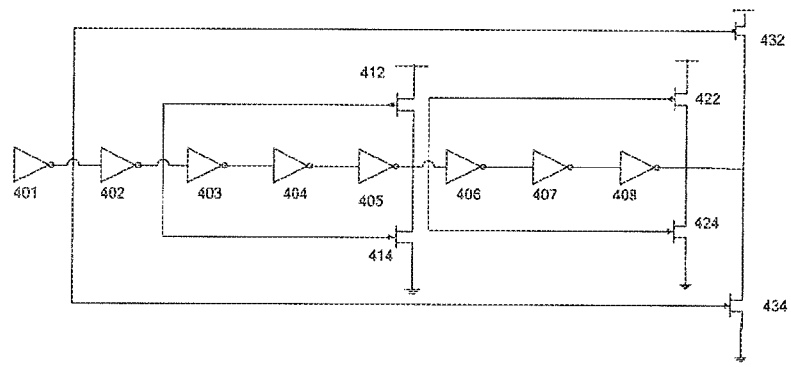
FIG. 4 is a schematic diagram of a buffer circuit according to still another embodiment of the present invention.

FIG. 4 is a schematic diagram of a buffer circuit according to an embodiment of the present invention. As shown in FIG. 4, the buffer circuit includes first-eighth level buffers 401-408 cascaded with each other. A PMOS transistor 412 and an NMOS transistor 414 are arranged between an input terminal of the buffer 403 and an output terminal of the buffer 405; a PMOS transistor 422 and an NMOS transistor 424 are arranged between an input terminal of the buffer 406 and an output terminal of the buffer 408; and a PMOS transistor 432 and an NMOS transistor 434 are arranged between an input terminal of the buffer 402 and an output terminal of the buffer 408. The effect of the PMOS transistor 412 and the NMOS transistor 414, the PMOS transistor 422 and the NMOS transistor 424, the PMOS transistor 432 and the NMOS transistor 434 is similar to those described above, and descriptions thereof will be omitted.

It should be noted that each buffer in the buffer group may have different buffering (driving) capability. For instance, buffers with higher levels have greater driving capability such as 3×, 10×, 32× and 100×.

The detailed embodiments described above have further illustrated in detail the purpose, the technical solution and the advantageous effects of the present invention; however, it should be understood that the above description is only embodiments of the present invention and is not intended to limit the present invention; any change, equivalent replacement and modification within the spirit and principle of the present invention shall fall within the protection scope of the present invention.

What is claimed is:
1. A buffer circuit, comprising:
a first buffer and a buffer group including an odd number of cascaded buffers;
a PMOS transistor; and
an NMOS transistor;
wherein driving capabilities of the PMOS transistor and the NMOS transistor, respectively, are less than a driving capability of a buffer with a highest level in the buffer group;
wherein a source of the PMOS transistor is coupled to a power source, a drain thereof is connected to an output terminal of the buffer group, and a gate thereof is connected to both an input terminal of the buffer group and an output terminal of the first buffer; and
wherein a source of the NMOS transistor is coupled to ground, a drain thereof is connected to the output terminal of the buffer group, and a gate thereof is connected to both the input terminal of the buffer group and the output terminal of the first buffer.
2. The buffer circuit according to claim 1, wherein the driving capabilities of the PMOS transistor and the NMOS transistor, respectively, are one half of the driving capability of the buffer with the highest level in the buffer group.
3. An electronic device, comprising the buffer circuit according to claim 2.
4. An electronic device, comprising the buffer circuit according claim 1.
5. The buffer circuit according to claim 1, wherein the driving capabilities of the PMOS transistor and the NMOS transistor, respectively, are one quarter of the driving capability of the buffer with the highest level in the buffer group.
6. An electronic device, comprising the buffer circuit according to claim 5.
7. The buffer circuit according to claim 1, wherein the buffers are different from each other.

\* \* \* \* \*